(12) United States Patent
Maeda et al.

(10) Patent No.: US 7,180,375 B2
(45) Date of Patent: Feb. 20, 2007

(54) PLL CIRCUIT

(75) Inventors: Tadashi Maeda, Tokyo (JP); Noriaki Matsuno, Tokyo (JP); Keiichi Numata, Tokyo (JP)

(73) Assignee: NEC Corporation, Tokyo (JP)

( * ) Notice: Subject to any disclaimer, the term of this patent is extended or adjusted under 35 U.S.C. 154(b) by 88 days.

(21) Appl. No.: 10/535,706

(22) PCT Filed: Nov. 21, 2003

(86) PCT No.: PCT/JP03/14887

§ 371 (c)(1),
(2), (4) Date: May 20, 2005

(87) PCT Pub. No.: WO2004/049575

PCT Pub. Date: Jun. 10, 2004

(65) Prior Publication Data

US 2005/0253658 A1    Nov. 17, 2005

(30) Foreign Application Priority Data

Nov. 22, 2002 (JP) .............................. 2002-339395

(51) Int. Cl.
*H03L 7/06* (2006.01)
*H03L 7/099* (2006.01)
*H03L 7/10* (2006.01)

(52) U.S. Cl. ..................... 331/1 A; 331/17; 331/34; 331/179

(58) Field of Classification Search ............. 331/1 A, 331/8, 10–11, 14, 179, 16–18, 25, 34, DIG. 2; 327/156–159; 375/376; 455/260

See application file for complete search history.

(56) References Cited

U.S. PATENT DOCUMENTS

| 6,411,168 | B2 | 6/2002 | Yoshida |
| 6,687,321 | B1 | 2/2004 | Kada et al. |
| 6,714,772 | B2 | 3/2004 | Kasahara et al. |
| 2005/0253658 | A1* | 11/2005 | Maeda et al. .................. 331/2 |

FOREIGN PATENT DOCUMENTS

| JP | 59-157317 | 10/1984 |
| JP | 01-123508 | 5/1989 |
| JP | 03-103611 | 10/1991 |
| JP | 05-300479 A | 11/1993 |

(Continued)

*Primary Examiner*—David Mis
(74) *Attorney, Agent, or Firm*—Foley & Lardner LLP

(57) ABSTRACT

A PLL circuit comprises a phase comparator for comparing phases between a reference signal and an internal signal and outputting a phase difference signal according to a phase difference therebetween, a voltage controlled oscillator group composed of a plurality of oscillators which have mutually different frequency variable ranges and whose oscillation frequencies are respectively controlled in accordance with a phase control signal, a selecting means for selecting one of the outputs from the plurality of oscillators based on the phase difference signal or the phase control signal, and a frequency divider for generating the internal signal by dividing an output of an oscillator selected by the selecting means, and when the oscillator selecting state is changed, an output phase of the frequency divider is approximated to the phase of the reference signal. Thereby, a required voltage controlled oscillator can be selected in a short time according to a desirable oscillation frequency.

27 Claims, 12 Drawing Sheets

FOREIGN PATENT DOCUMENTS

| | | |
|---|---|---|
| JP | 06-104748 A | 4/1994 |
| JP | 06-303134 | 10/1994 |
| JP | 07-336556 A | 12/1995 |
| JP | 08-107351 A | 4/1996 |
| JP | 09-214335 A | 8/1997 |
| JP | 09-246962 | 9/1997 |
| JP | 2001-060870 | 3/2001 |
| JP | 2001-094417 | 4/2001 |
| JP | 2001-144609 | 5/2001 |
| JP | 2001-237640 | 8/2001 |
| JP | 2001-237699 | 8/2001 |
| JP | 2002-261607 A | 9/2002 |

\* cited by examiner

PLL CIRCUIT

TECHNICAL FIELD

The present invention relates to a PLL (Phase Locked Loop) circuit with built-in voltage controlled oscillators, and particularly, to a PLL circuit which requires a wide oscillation frequency band.

BACKGROUND ART

With diversification in mobile communication systems in recent years, carrying out transmission and reception in various methods by use of a single mobile communication terminal has been demanded, and meanwhile, normally, since different mobile communication systems employ different frequency bands, a transmitting and receiving function in multiple frequency bands, a so-called multiband radio function has been required for such a multi-mode terminal.

For a frequency synthesizer used in a multiband radio, it is necessary to be capable of generating local signals in various frequency bands corresponding to the multibands. For example, methods such as GSM (Global System for Mobile Communications) employing a 900 MHz band, DCS (Digital Cellular System) employing a 1800 MHz band, PCS (Personal Communication Services) employing a 1900 MHz band, and UMTS (Universal Mobile Telecommunication System) employing a 2 GHz band have been widely utilized around the world, and development of a four-band radio which can be used for all these frequency bands has been demanded.

In the case of realizing a frequency synthesizer corresponding to such a four-band radio, it is necessary to prepare respective unit synthesizers for GSM transmission, for GSM reception, for DCS transmission, for DCS reception, for PCS transmission, for PCS reception, for UMTS transmission, and for UMTS reception. Since the reception frequency of PCS and transmission frequency of UMTS are almost identical in their bands, both can be used by a single synthesizer, however, this is merely a special case, and basically, unit synthesizers in a number respectively corresponding to necessary multiple frequencies are prepared. Accordingly, if the number of bands increases, the number of unit synthesizers increases in proportion thereto, and hardware results on a huge scale.

As a method for solving such problems, a method of improving an oscillator in modulation sensitivity so as to expand a variable range of the oscillator itself can be considered, however, in this case, there is a problem of fluctuation in frequency of a local oscillator owing to noise and the like from the outside and inside of the chip.

In addition, there is a construction to generate signals having a plurality of frequency bands greater in the number of unit synthesizers by a small-scale circuit configuration provided by combining an arithmetic circuit composed of a frequency divider and a mixer for multiplication with two unit synthesizers. However, this cannot correspond to all the combining communication methods, and there is a drawback in that the number of synthesizers is consequently increased.

Therefore, a method for selecting a voltage controlled oscillator by an external signal according to a desirable oscillation frequency to be obtained has been suggested by use of a plurality of voltage controlled oscillators having different controlled voltage-oscillation frequency characteristics.

In this method, since the plurality of voltage controlled oscillators take charge of mutually different frequency ranges, the frequency range as a whole being wide, although each voltage controlled oscillator has a narrow frequency variable range. Since each voltage controlled oscillator has a narrow frequency variable, each voltage controlled oscillator can take a small modulation sensitivity, which makes it possible to stably operate synthesizers.

FIG. 10 is a diagram showing a configuration example of a quadruple circuit to select from a plurality of voltage controlled oscillators by an external signal and generate a clock.

The present conventional art is, as shown in FIG. 10, a quadruple circuit composed of a PLL circuit having a phase comparator 1, a charge pump 2, a loop filter 3, a voltage controlled oscillator group 4 consisting of four voltage controlled oscillators having different control voltage-oscillation frequency characteristics, a selection circuit 6, a frequency divider 5, an N-channel MOS transistor NM5, and a resistor R. When an output signal S14 from the selection circuit 6 is high in potential (H), the N-channel MOS transistor NM5 is turned on, and by a series connection circuit composed of the resistor R and MOS transistor NM5, current of an output signal S4 from the loop filter 3 is extracted, and potential of a signal S4 line is set to a voltage within a range between reference voltages Vref1 and Vref2, which will be described later (see Japanese Published Unexamined Patent Application No. H09-214335.)

In the following, operations of a quadruple circuit constructed as described above will be described.

The phase comparator 1 generates output signals S1 and S2 based on results of a comparison between a reference signal CK1 and an internal signal CK2. The signal S1 is a signal to indicate a phase lead amount of the reference signal CK1 over the internal signal CK2, the signal S2 is a signal to show a phase lead amount of the internal signal CK2 over the reference signal CK1, and these signals S1 and S2 are inputted into the charge pump 2.

An output signal S3 from the charge pump 2 is inputted into the loop filter 3 and is, after a high-frequency component is removed by the loop filter 3, inputted into the voltage controlled oscillator group 4 as a control voltage S4 of the voltage controlled oscillator group 4.

In the voltage controlled oscillator group 4, signals S10 to S13 generated in the selection circuit 6 are inputted so that one voltage controlled oscillator is selected from the four voltage controlled oscillators of the voltage controlled oscillator group 4. An output signal CK3 from the voltage controlled oscillator group 4 is divided into four by the voltage divider 5 to become an internal signal CK2.

In the conventional art, the circuit locks when operation is performed so that the signal CK1 and signal CK2 coincide in frequency and phase, and a frequency of the signal CK3 obtained from the voltage controlled oscillator group 4 becomes quadruple that of the reference signal CK1.

FIG. 11 is a block diagram showing a configuration of the selection circuit 6 shown in FIG. 10.

When the output signals S10 to S13 from the selection circuit 6 are changed, the output signal S14 becomes high in potential (H) for a fixed time, and thereby, potential of the signal S4 is set so as to be in a range of threshold voltages Vref1 and Vref2 (Vref2>Vref1).

In the selection circuit 6, a voltage comparator 418 having a threshold voltage Vref1 and a voltage comparator 419 having a threshold voltage Vref2 are provided. In the voltage comparator 418, an output signal S15 is set to a high potential (H) when voltage of the inputted control signal S4 is lower than the threshold voltage Vref1, and an output signal S15 is set to a low potential (L) when voltage of the control signal S4 is higher than the threshold voltage Vref1. In addition, in the voltage comparator 419, an output signal S16 is set to a high potential (H) when voltage of the inputted control signal S4 is lower than the threshold voltage Vref2, and an output signal S16 is set to a low voltage (L) when voltage of the control signal S4 is higher than the threshold voltage Vref2.

In addition, a NOR gate 420 for setting a signal S17 to a high potential (H) when the signals S15 and S16 are both low in potential (L) and for, in other cases, setting the same to a low potential (L), an AND gate 421 for setting a signal S18 to a high potential (H) when the signals S15 and S16 are both high in potential (H) and for, in other cases, setting the same to a low potential (L), 2-bit up counters 422 and 423, a subtractor 424 for subtracting an output count value S20 of the counter 423 from an output count value S19 of the counter 422, and a decoder 425 for setting any of only one of the output signals S10 to S13 to a high potential (H) in accordance with a count value S21 inputted from the subtractor 424 are provided.

By the selection circuit 6 having such operation characteristics, from the four voltage controlled oscillators having different control voltage-oscillation frequency characteristics, one voltage controlled oscillator according to a quadruple frequency of the frequency of the reference signal CK1 is automatically selected.

Furthermore, when the selecting state is changed by the selection circuit 6, the signal S14 is temporarily made high in potential (H), and potential of the signal S4 is forcibly set to a value higher than a threshold voltage Vref1 shown in FIG. 12 and also lower than a threshold value Vref2, therefore, outputs from the NOR gate 420 and AND gate 421 are once returned to a low potential (L), whereby in the selecting state of the voltage controlled oscillator group 4 having different control voltage-oscillation frequency characteristics, malfunction can be prevented.

FIG. 12 is a characteristics diagram showing oscillation frequency characteristics, with respect to a voltage of the control signal S4, of the voltage controlled oscillator group 4 shown in FIG. 10. Here, frequencies f1 to f8 have a relationship of f1<f2<f3<f4<f5<f6<f7<f8.

First, description will be given for a case where a desirable oscillation frequency, namely, a quadruple frequency fosc of a frequency of the reference signal CK1 to be inputted into the phase comparator 1 is f1<fosc<f2.

When a lock occurs only at a characteristic D shown in FIG. 12, namely, when voltage of the control signal S4 is not deviated from the range between the threshold voltage Vref1 and threshold voltage Vref2, the output signals S17 and S18 from the NOR gate 420 and AND gate 421 never become high in potential (H), therefore, the counters 422 and 423 never perform a counting operation, and the condition of the output signals S10 to S13 does not change from their initial condition.

In addition, when the characteristic shifts to a characteristic C shown in FIG. 12, further shifts to a characteristic B, and the circuit is finally locked, operations are as follows.

When the control voltage S4 exceeds the threshold voltage Vref2 at the characteristic D, the output signal S17 from the NOR gate 420 becomes high in potential (H), the output value S19 from the counter 422 and an output value S21 from the subtractor 424 are increased by one, whereby, in the decoder 425, only the output signal S13 is switched over from a high-potential (H) condition to a low-potential (L) condition, also only the output signal S12 is switched over from a low-potential (L) condition to a high-potential state (H) condition, and the characteristic shifts to the characteristic C.

At this time of switching over, since the signal S14 temporarily becomes high in potential (H) and the control signal S4 temporarily returns to a voltage in the range between the threshold voltage Vref1 and threshold voltage Vref2, the output signal S17 from the NOR gate 420 changes from a high potential (H) to a low potential (L).

Even after PLL control according to the characteristic C is performed as such, since frequency of the internal signal is still lower than the quadruple frequency of the reference signal, the control voltage S4 again exceeds the threshold voltage Vref2, the selection circuit 6 repeats the aforementioned operations, and the characteristic shifts to the characteristic B. At this point in time, from the voltage controlled oscillator group 4, a frequency roughly the same as that of the reference signal CK1 is being outputted, however, since the phase of the frequency divider 5 does not change in a short time, the phase comparator 1 still operates so as to set the frequency of the internal signal high, and consequently, the control voltage S4 again exceeds the threshold value Vref2, the selection circuit 6 repeats the aforementioned operations, and the characteristic shifts to a characteristic A.

As a result, frequency of the voltage controlled oscillator group 4 becomes higher than that of the reference signal, the phase of the frequency divider 5 has a lead over that of the reference signal, therefore, the control voltage S4 falls below the threshold voltage Vref1, and the characteristic is again shifted to the characteristic B by the selection circuit 6.

Thereafter, the two frequencies are equalized, and a lock finally occurs at the characteristic B.

However, as mentioned above, in a case where a voltage controlled oscillator is selected according to a desirable oscillation frequency by use of a plurality of voltage controlled oscillators having different control voltage-oscillation frequency characteristics, although a broadband PLL circuit can be realized, since, even when a preferred voltage controlled oscillator is selected, the phase of the frequency does not change in a short time, an output from the phase comparator does not sufficiently follow a change in frequency, and consequently, a considerably long time is spent before an optimal oscillator is selected, therein a problem exists.

Since the phase is integration of the frequency, even if an optimal oscillator is selected and an internal signal having a frequency identical to that of the reference signal is inputted into the phase comparator, it takes a great deal of time to bring about an output from the phase comparator into a locked condition, and the output is not immediately brought into a locked condition.

DISCLOSURE OF THE INVENTION

An object of the present invention is to provide a PLL circuit capable of selecting a required voltage controlled oscillator according to a desirable oscillation frequency in a short time by use of a plurality of voltage controlled oscillators having different control voltage-oscillation frequency characteristics.

In order to achieve the above-described object, a PLL circuit according to the present invention comprises: a phase comparing means for comparing phases between a reference signal and an internal signal and outputting a phase difference signal according to a phase difference therebetween; a plurality of oscillators which have mutually different frequency variable ranges and whose oscillation frequencies are respectively controlled in accordance with a phase difference signal; a selecting means for selecting one of the outputs from the plurality of oscillators based on the phase difference signal; and a frequency dividing means for generating the internal signal by dividing an output of the oscillator selected by the selecting means, wherein provided is a means for approximating, when the oscillator selecting state is changed, an output phase of the frequency dividing means to the phase of the reference signal.

In addition, the plurality of oscillators have mutually overlapping frequency variable ranges.

Furthermore, the plurality of oscillators have mutually different operating frequency ranges.

Still furthermore, the selecting means switches over outputs from the plurality of oscillators based on a history of the phase difference signal or the phase control signal.

Still furthermore, the oscillators are voltage controlled oscillators, and provided is a means for converting the phase difference signal to an oscillator control voltage.

In addition, provided is a means for setting two threshold voltages having mutually different values within a variable voltage range of the control voltage of the voltage controlled oscillator and temporarily setting, when the voltage controlled oscillator selecting state is changed, a value of the oscillator control voltage in a range between the two threshold voltages.

In addition, provided is a means for changing a value of the temporarily setting the oscillator control voltage in accordance with a history when the voltage controlled oscillator selecting state is changed.

In addition, when the voltage controlled oscillator selecting state is switched over as a result of the oscillator control voltage becoming out of the range between the two threshold voltages, the temporarily setting oscillator control voltage is set, out of the two threshold voltages, in the vicinity of the oscillator control voltage-side threshold voltage.

In addition, when the voltage controlled oscillator selecting state is switched over as a result of the oscillator control voltage becoming out of the range between the two threshold voltages and when the oscillator control voltage becomes out of the range between the two threshold voltages twice or more in series, the temporarily setting oscillator control voltage is set, out of the two threshold voltages, in the vicinity of the oscillator control voltage-side threshold voltage.

In addition, when the oscillator control voltage becomes out of the range between the two threshold voltages, depending on whether this oscillator control voltage is greater than the two threshold voltages or smaller than the two threshold voltages, whether setting the oscillator control voltage higher or setting the same lower than an intermediate potential between the two threshold voltages is controlled.

In addition, a PLL circuit according to the present invention comprises:

a phase comparing means for comparing phases between a reference signal and an internal signal and outputting a phase difference signal according to a phase difference therebetween;

a plurality of resonant circuits provided with mutually different resonance frequencies;

an oscillator whose oscillation frequency is controlled in accordance with the resonant circuits and a phase difference signal;

a selecting means for selecting one of the plurality of resonant circuits based on the phase difference signal; and a frequency dividing means for generating the internal signal by dividing an output from the oscillator, wherein provided is a means for approximating, when the resonant circuit selecting state is changed, an output phase of the frequency dividing means to the phase of the reference signal.

In addition, the selecting means switches over the plurality of resonant circuits based on a history of the phase difference signal or the phase control signal.

In addition, the oscillator is a voltage controlled oscillator, and provided is a means for converting the phase difference signal to an oscillator control voltage.

In addition, provided is a means for setting two threshold voltages having mutually different values within a variable voltage range of the control voltage of the voltage controlled oscillator and temporarily setting a value of the oscillator control voltage in a range between the two threshold voltages, when the resonant circuit selecting state is changed.

In addition, provided is a means for changing a value of the temporarily setting oscillator control voltage in accordance with a history when the resonant circuit selecting state is changed.

In addition, when the resonant circuit selecting state is switched over as a result of the oscillator control voltage becoming out of the range between the two threshold voltages, the temporarily setting oscillator control voltage is set, out of the two threshold voltages, in the vicinity of the oscillator control voltage-side threshold voltage.

In addition, when the resonant circuit selecting state is switched over as a result of the oscillator control voltage becoming out of the range between the two threshold voltages and when the oscillator control voltage becomes out of the range sandwiched between the two threshold voltages twice or more in series, the temporarily setting oscillator control voltage is set, out of the two threshold voltages, in the vicinity of the oscillator control voltage-side threshold voltage.

In addition, when the oscillator control voltage becomes out of the range between the two threshold voltages, depending on whether this oscillator control voltage is greater than the two threshold voltages or smaller than the two threshold voltages, whether setting the oscillator control voltage higher or setting the same lower than an intermediate potential between the two threshold voltages is controlled.

In addition, a PLL circuit according to the present invention comprises:

a phase comparing means for comparing phases between a reference signal and an internal signal and outputting a phase difference signal according to a phase difference therebetween;

an oscillator constructed by coupling a plurality of delay circuits whose delay times are respectively controlled in accordance with a phase difference signal;

a selecting means for switching over the coupling number of delay circuits based on the phase difference signal; and a frequency dividing means for generating the internal signal by dividing an output of the oscillator selected by the selecting means, wherein provided is a means for approximating, when the oscillator selecting state is changed, an output phase of the frequency dividing means to the phase of the reference signal.

In addition, the selecting means switches over the coupling number of the delay circuits based on a history of the phase difference signal or the phase control signal.

In addition, the oscillator is a voltage controlled oscillator, and provided is a means for converting the phase difference signal to an oscillator control voltage.

In addition, provided is a means for setting two threshold voltages having mutually different values within a variable voltage range of the control voltage of the voltage controlled oscillator and temporarily setting a value of the oscillator control voltage in a range between the two threshold voltages, when the delay circuit coupling number selecting state is changed.

In addition, provided is a means for changing a value of the temporarily setting oscillator control voltage in accordance with a history when the delay circuit coupling number selecting state is changed.

In addition, when the delay circuit coupling number selecting state is switched over as a result of the oscillator control voltage becoming out of the range between the two threshold voltages, the temporarily setting oscillator control voltage is set, out of the two threshold voltages, in the vicinity of the oscillator control voltage-side threshold voltage.

In addition, when the delay circuit coupling number selecting state is switched over as a result of the oscillator control voltage becoming out of the range between the two threshold voltages and when the oscillator control voltage becomes out of the range between the two threshold voltages twice or more in series, the temporarily setting oscillator control voltage is set, out of the two threshold voltages, in the vicinity of the oscillator control voltage-side threshold voltage.

In addition, when the oscillator control voltage becomes out of the range between the two threshold voltages, depending on whether this oscillator control voltage is higher than the two threshold voltages or lower than the two threshold voltages, whether setting the oscillator control voltage higher or setting the same lower than an intermediate potential between the two threshold voltages is controlled.

In addition, the output phase of the frequency dividing means is synchronized with the phase of the reference signal.

In the present invention constructed as in the above, a PLL circuit comprises: a phase comparing means for comparing phases between a reference signal and an internal signal and outputting a phase difference signal according to a phase difference therebetween; a plurality of oscillators which have mutually different frequency variable ranges and whose frequencies are respectively controlled in accordance with a phase control signal; a selecting means for selecting one of the outputs from the plurality of oscillators based on the phase difference signal or the phase control signal; and a frequency dividing means for generating the internal signal by dividing an output of the oscillator selected by the selecting means, and when the oscillator selecting state is changed, an output phase of the frequency divider is approximated to the phase of the reference signal, therefore, in a PLL circuit using a plurality of voltage controlled oscillators having different control voltage-oscillation frequency characteristics, a required voltage controlled oscillator can be selected according to a desirable oscillation frequency in a short time.

Accordingly, in the present invention, when realizing a broadband PLL circuit by use of a plurality of voltage controlled oscillators having different control voltage-oscillation frequency characteristics, a required voltage controlled oscillator can be automatically selected according to a desirable oscillation frequency in a considerably short time, therefore, it becomes possible to avoid, in a system using while switching over a plurality of radio methods, causing a considerably prolonged frequency setting time, thus the invention is preferable for such a system.

BEST MODE FOR CARRYING OUT THE INVENTION (First Embodiment)

Figure 1:
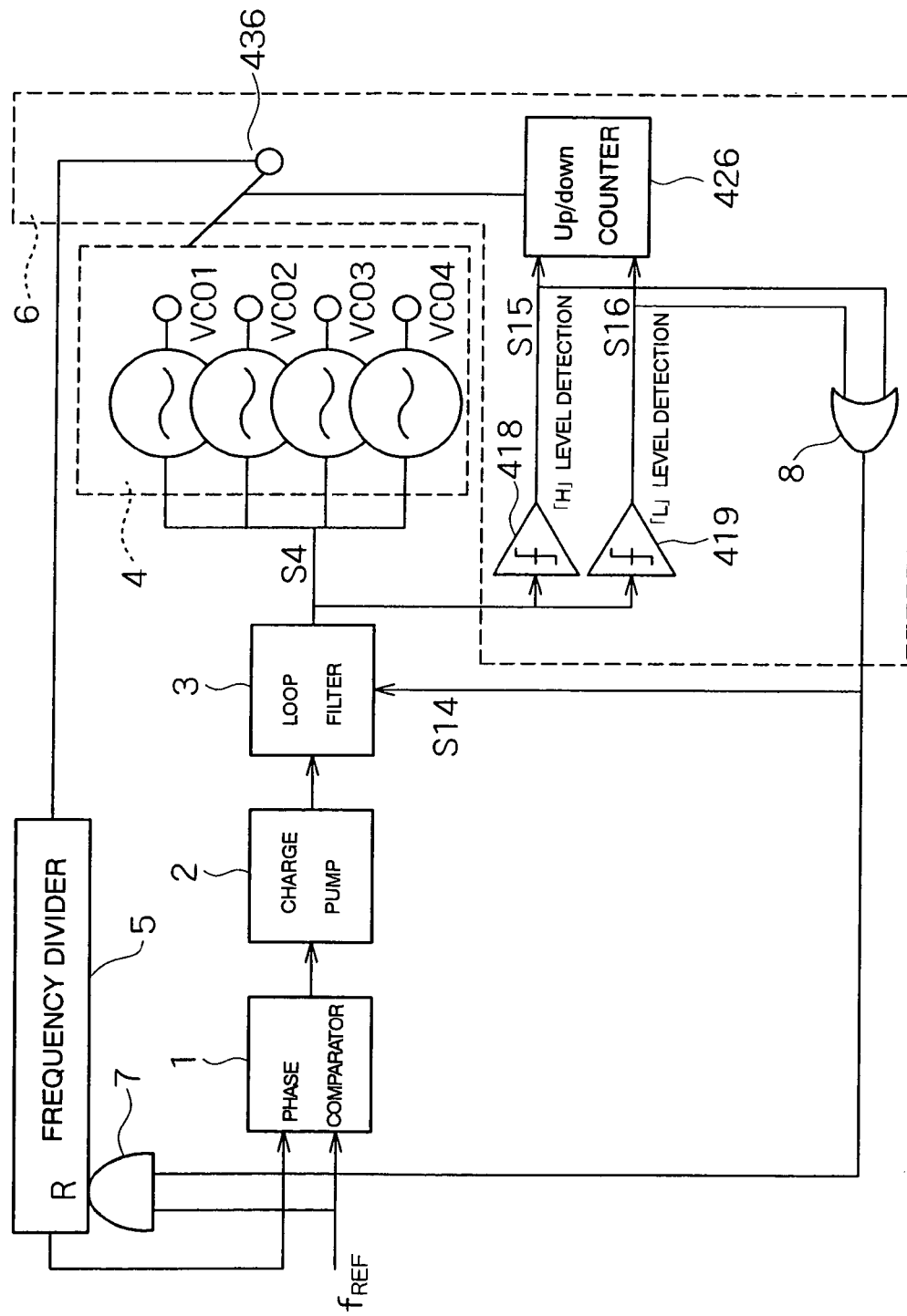
FIG. 1 is a block diagram showing a configuration example of a quadruple circuit to which a first embodiment of a PLL circuit of the present invention has been applied.
Figure 10:
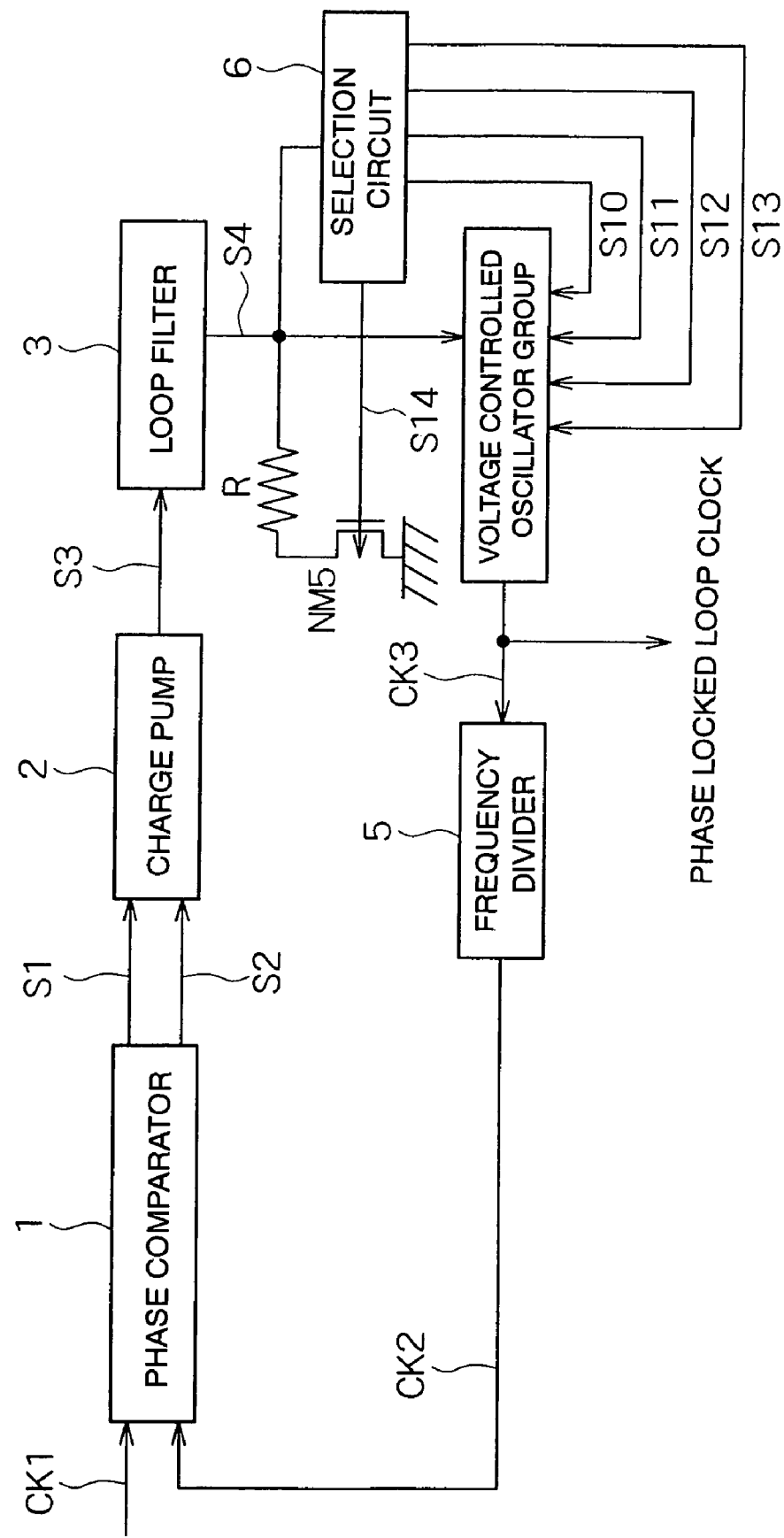
FIG. 10 is a diagram showing a configuration example of a quadruple circuit to select from a plurality of voltage controlled oscillators by an external signal and generate a clock.
Figure 11:
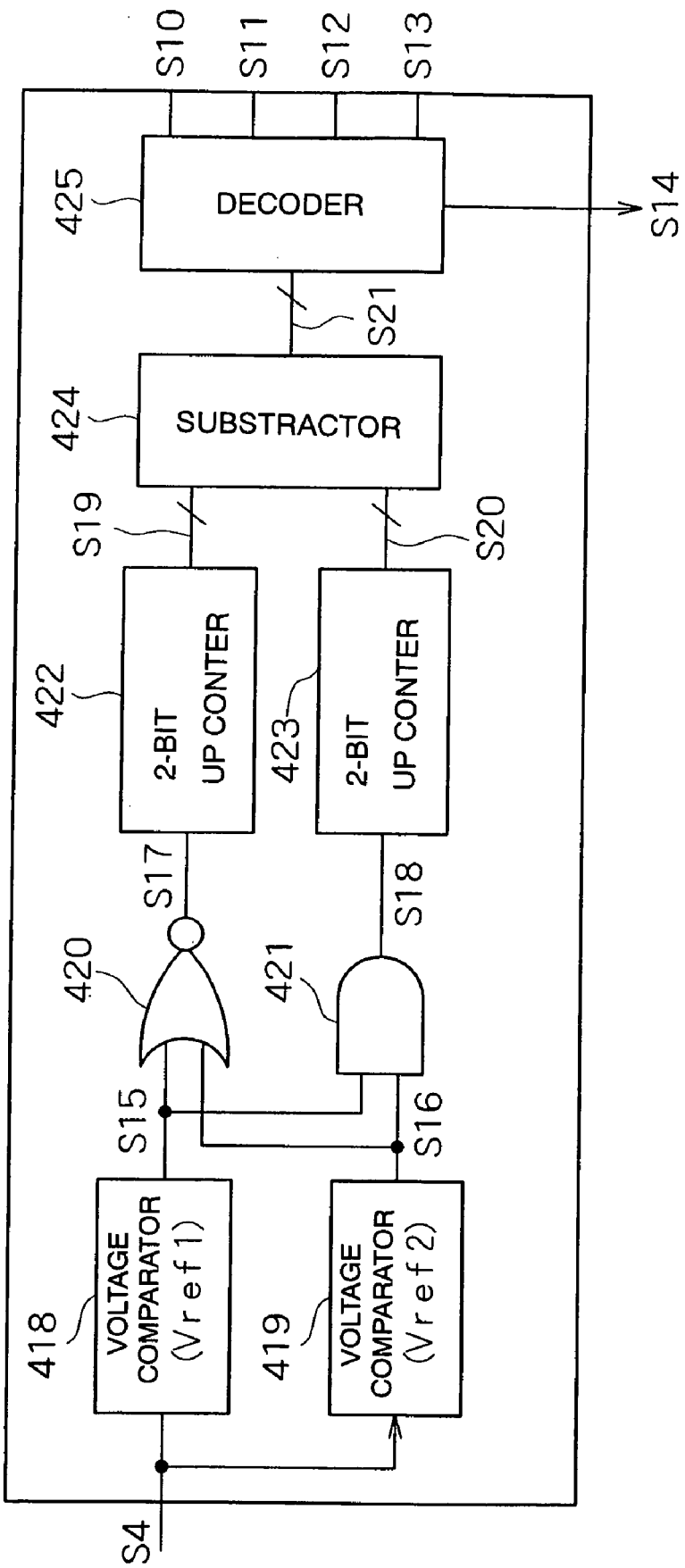
FIG. 11 is a block diagram showing a configuration of a selection circuit shown in FIG. 10.
Figure 12:
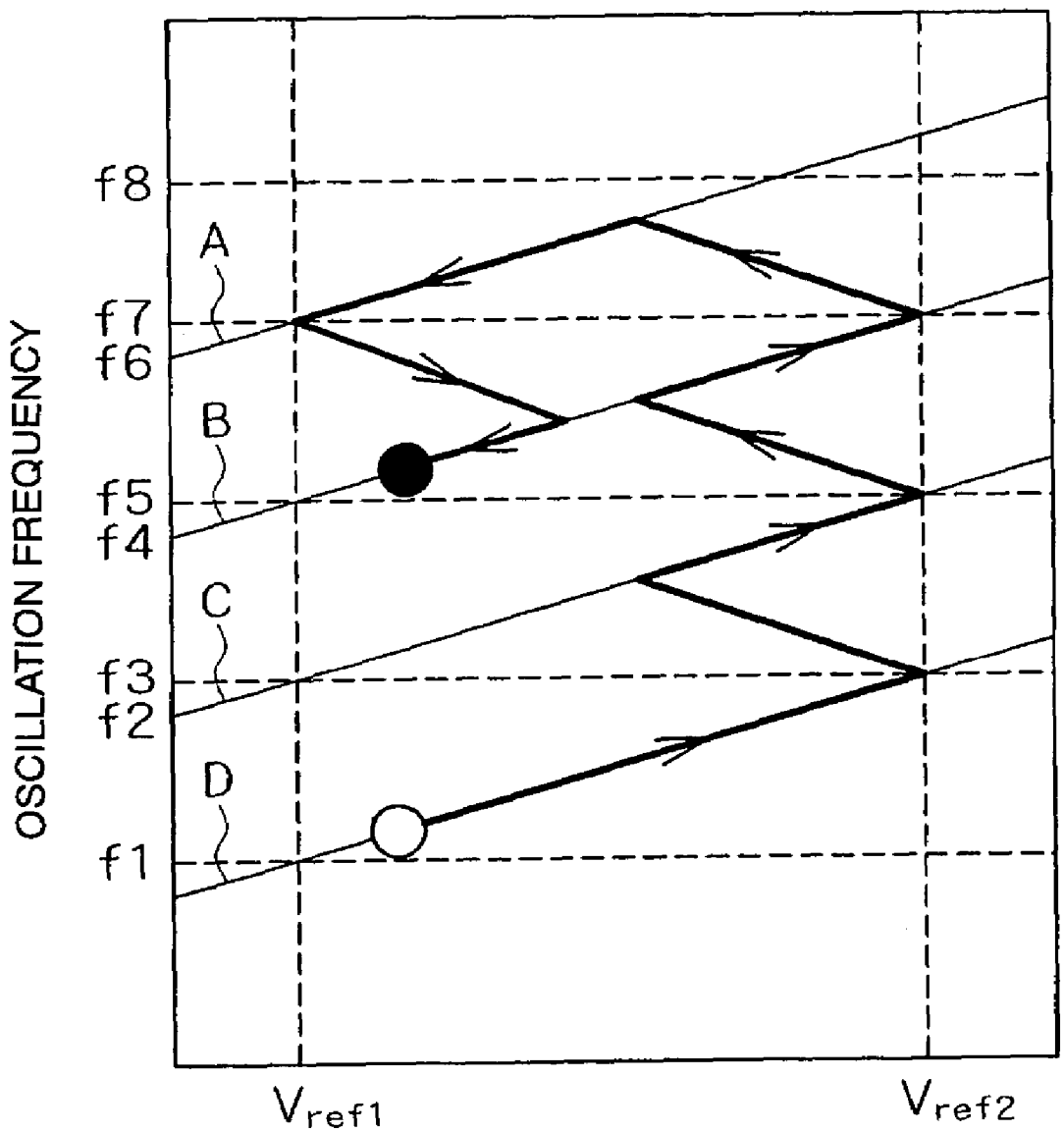
FIG. 12 is a characteristics diagram showing oscillation frequency characteristics, with respect to a voltage of a control signal, of a voltage controlled oscillator group shown in FIG. 10.

FIG. 1 is a block diagram showing a configuration example of a quadruple circuit to which a first embodiment of a PLL circuit of the present invention has been applied. Here, in FIG. 1, identical symbols will be used for components identical to those shown in FIG. 10, whereby a detailed description thereof will be omitted.

As shown in FIG. 1, in the present embodiment, a 2-input AND circuit 7 whose first input is a reference signal and whose second input is a signal from a selection circuit 6 is further provided, an output therefrom is inputted into a reset terminal of a frequency divider 5, and by this signal, a frequency divider output and the reference signal are synchronized in phase.

In addition, inside the selection circuit 6, a voltage comparator 418 having a threshold voltage Vref1 and a voltage comparator 418 having a threshold voltage Vref2 (>Vref1) are provided. In one voltage comparator 419, an output signal S15 is set to a high potential (H) for a fixed time when a voltage of an inputted control signal S4 is lower than the threshold voltage Vref1, and an output signal S15 is set to a low potential (L) for a fixed time when a voltage of an inputted control signal S4 is higher than the threshold voltage Vref1. In addition, in the other voltage comparator 418, an output signal S16 is set to a high potential (H) for a fixed time when a voltage of an inputted control signal S4 is higher than the threshold value Vref2, and an output signal S16 is set to a low potential (L) for a fixed time when a voltage of an inputted control signal S4 is lower than the threshold value Vref2.

The outputs S15 and S16 from the voltage comparators 418 and 419 are inputted into an up/down counter 426, and in accordance with an output therefrom, a selection switch 436 is switched over. By the selection circuit 6 having such operating characteristics, from four voltage-controlled oscillators having different control voltage-oscillation frequency characteristics, one voltage controlled oscillator according to a quadruple frequency of a frequency of the reference signal CK1 is automatically selected in accordance with a voltage value of the control signal S4.

Figure 2:
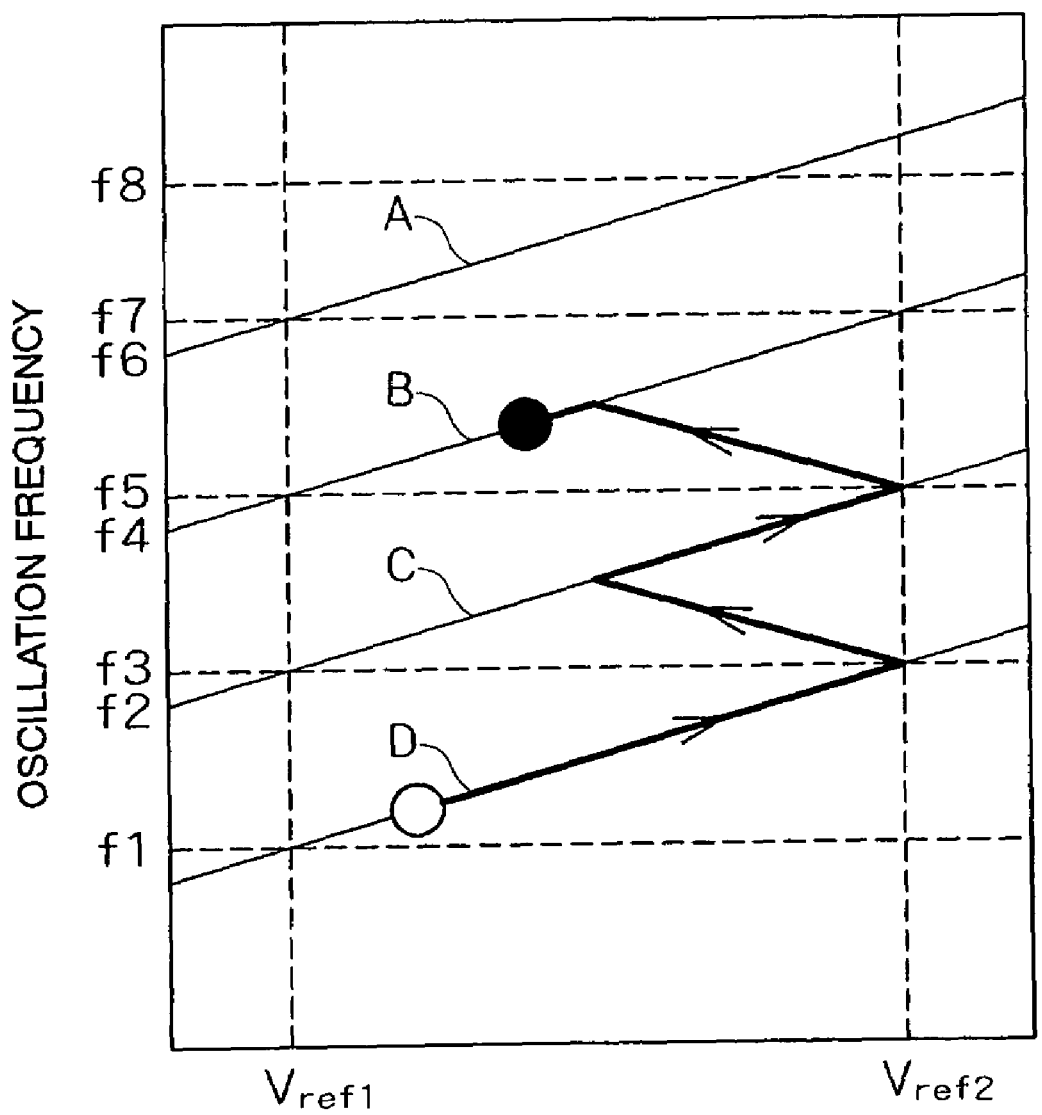
FIG. 2 is a characteristics diagram showing oscillation frequency characteristics, with respect to a voltage of a control signal, of a voltage controlled oscillator group shown in FIG. 1.

Furthermore, when the selecting state is changed by the selection circuit 6, a signal S14 temporarily becomes high in potential (H), potential of an output signal S4 from a loop filter 3 is forcibly set to a value higher than the threshold voltage Vref1 shown in FIG. 2 and also lower than the threshold value Vref2, therefore, outputs from the voltage comparators 418 and 419 are once returned to a low potential (L). Furthermore, by the 2-input AND circuit 7 into which the signal S14 and reference signal are inputted, the frequency divider 5 is reset for a fixed period of time at a point in time of change in the voltage controlled oscillator selecting state, whereby, the reference signal and an output phase of the frequency divider 5 are synchronized. Thereby, a great change in frequency caused by a change in the voltage controlled oscillator selecting state is to be detected by the phase comparator 1 in a short time, thus in the selecting state of a voltage controlled oscillator group 4 having different control voltage-oscillation frequency characteristics, malfunction can be prevented.

As has been described above, in a semiconductor integrated circuit including four voltage-controlled oscillators having different control voltage-oscillation frequency characteristics, conventionally, only the output signal S4 from the loop filter 3 to prevent malfunction when switching over voltage controlled oscillators has been forcibly controlled, however, in the present embodiment, by forcibly synchronizing also an output phase of the frequency divider 5 with the reference signal, it becomes possible to select a preferred voltage controlled oscillator in a considerably short time.

FIG. 2 is a characteristics diagram showing oscillation frequency characteristics of a voltage controlled oscillator group 4 shown in FIG. 1, with respect to a voltage of a control signal S4. Here, A to D are respectively control voltage-oscillation frequency characteristics of four oscillators, and frequencies f1 to f8 have a relationship of f1<f2<f3<f4<f5<f6<f7<f8.

First, description will be given for a case where a desirable oscillation frequency, namely, a quadruple frequency fosc of a frequency of a reference signal CK1 to be inputted is f1<fosc<f2.

When a lock occurs only at a characteristic D shown in FIG. 2, namely, when voltage of the control signal S4 is not deviated from the range between the threshold voltage Vref1 and threshold voltage Vref2, the output signals S15 and S16 from the voltage comparators 418 and 419 never become high in potential (H), therefore, the counter 426 never performs a counting operation, and the condition of the selection circuit 6 does not change from its initial condition.

In addition, when the characteristic shifts from the characteristic D to a characteristic C shown in FIG. 2, further shifts to a characteristic B, and the circuit is finally locked, operations are as follows.

When the control voltage S4 exceeds the threshold voltage Vref2 at the characteristic D, the output signal S16 from the voltage comparator 418 becomes high in potential (H) for a fixed time, whereby, the counter 426 performs an up-counting operation by one. Simultaneously with the voltage controlled oscillator selecting state shifting from the characteristic D to the characteristic C, the signal S14 temporarily becomes high in potential (H), and the control signal S4 temporarily returns to the range between the threshold value Vref1 and threshold value Vref2, therefore, a change in the output signal S16 to a high potential (H) after switching over the voltage controlled oscillators is prevented.

Furthermore, by the 2-input AND circuit 7 into which the signal S14 and reference signal are inputted, the frequency divider 5 is reset for a fixed period of time at a point in time of change in the voltage controlled oscillator selecting state, whereby, the reference signal and an output signal of the frequency divider 5 are synchronized in phase, whereby, a great change in frequency caused by a change in the voltage controlled oscillator selecting state is detected by a phase comparator 1 in a short time, thus in the selecting state of a voltage controlled oscillator group 4 having different control voltage-oscillation frequency characteristics, malfunction is prevented.

Even after PLL control according to the characteristic C is performed as such, since frequency of the internal signal is still lower than the quadruple frequency of the reference signal, the control voltage S4 again exceeds the threshold voltage Vref2, the selection circuit 6 repeats the aforementioned operations, and the characteristic shifts to a characteristic B. At this point in time, the voltage controlled oscillator is outputting a frequency roughly the same as that of the reference signal, while the phase of the frequency divider 5 also has a value according thereto, therefore, the two frequencies are thereafter equalized, and a lock finally occurs at the characteristic B.

On the other hand, if, for example, the frequency of the reference signal CK1 is switched over so as to make a desirable oscillation frequency fosc f1<fosc<f2 in a condition currently being locked to the characteristic B, the characteristic switches over, for example, from the characteristic B to characteristic C to characteristic D, and the circuit is finally locked to the characteristic D.

(Second Embodiment)

Figure 3:
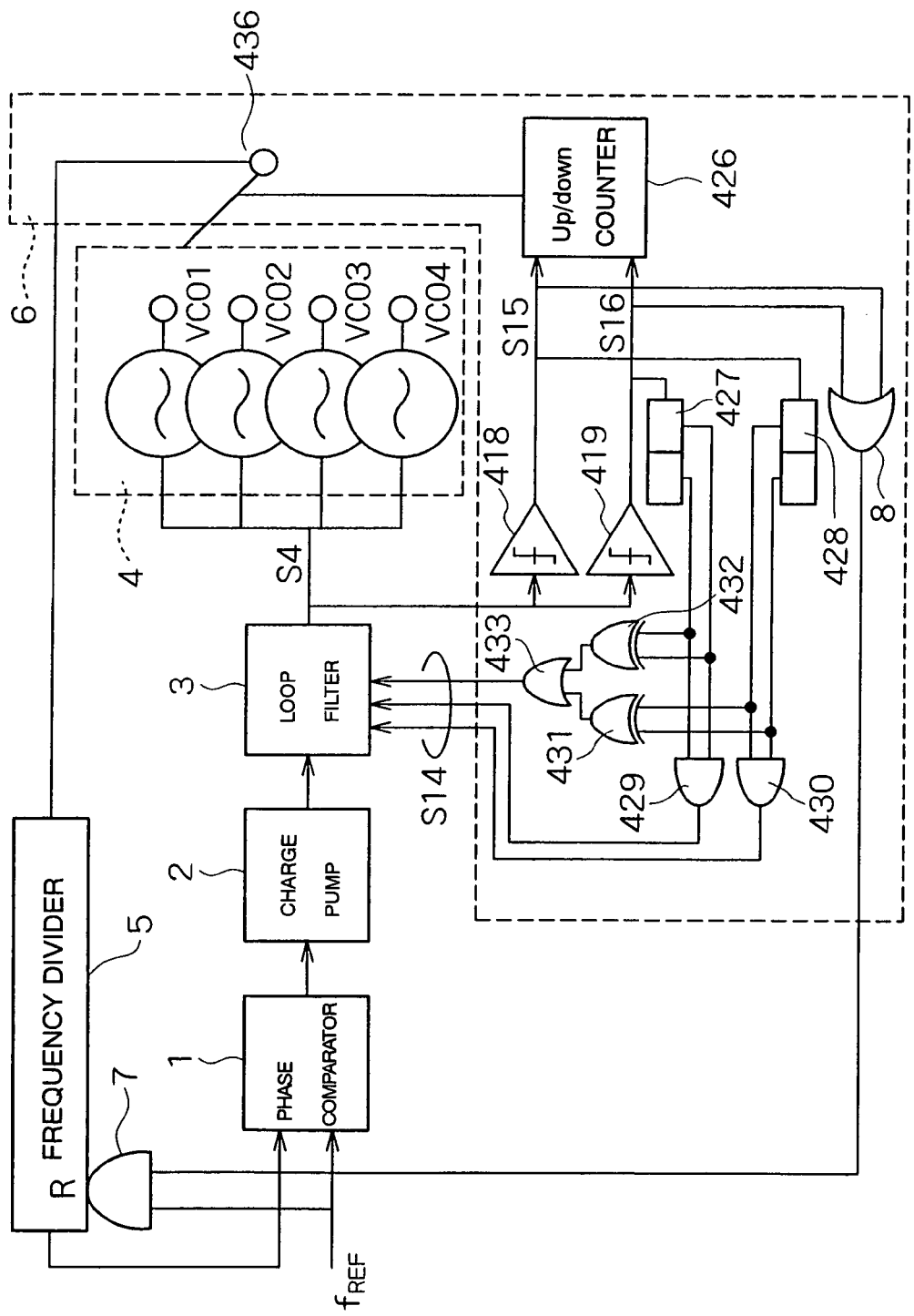
FIG. 3 is a block diagram showing a configuration example of a quadruple circuit to which a second embodiment of a PLL circuit of the present invention has been applied.

FIG. 3 is a block diagram showing a configuration example of a quadruple circuit to which a second embodiment of a PLL circuit of the present invention has been applied. Here, in FIG. 3, identical symbols will be used for components identical to those shown in FIG. 1, whereby a detailed description thereof will be omitted.

As shown in FIG. 3, in the present embodiment, to components shown in the first embodiment, added is a circuit for storing outputs from the voltage comparators 418 and 419 in history counters 427 and 428 and changing, based on the history information stored in the history counter 427 and 428, a voltage value to forcibly set an output potential from the loop filter 3.

In the present embodiment, when the selecting state is changed by the selection circuit 6, in a case where up or down signals into the up/down counter 426 are inputted in series, an output value from the loop filter 3 is forcibly set, if up signals are consecutive, lower than the threshold value Vref2 and in the vicinity thereof, and if down signals are consecutive, higher than the threshold value Vref1 and in the vicinity thereof.

The history counters 427 and 428 are composed of 2-bit shift resisters, respectively, and outputs therefrom are respectively inputted into 2-input AND circuit 429 and 430 and 2-input EXOR circuits 431 and 432.

When up signals are inputted twice or more in series, since the up history counter 427 outputs, as 2-bit output, the same values, an output from the AND circuit 429 becomes high in potential (H), whereby, an output S4 from the loop filter 3 is forcibly set lower than the threshold value Vref2 and in the vicinity thereof.

When down signals are inputted twice or more in series, since the down history counter 428 outputs, as 2-bit output, the same values, an output from the AND circuit 430 becomes high in potential (H), whereby, an output S4 from the loop filter 3 is forcibly set higher than the threshold value Vref1 and in the vicinity thereof.

In addition, when neither up signals nor down signals are inputted twice or more in series, outputs from the two EXOR circuits 431 and 432 become high in potential (H), and as a result, an output from an OR circuit 433 is high in potential (H), and an output from the loop filter 3 is set to the middle between the threshold values Vref1 and Vref2.

Thereby, even when design is provided with a large number of oscillators to cover a wide frequency range, a shifting time from a lowest-frequency characteristic to a highest-frequency characteristic can be shortened.

Furthermore, by the 2-input AND circuit 7 into which the signal S14 and reference signal are inputted, the frequency divider 5 is reset for a fixed period of time at a period in time of change in the voltage controlled oscillator selecting state, whereby the phases of the reference signal and an output of the frequency divider 5 are synchronized. Thereby, a great change in frequency caused by a change in the voltage controlled oscillator selecting state is to be detected by the phase comparator 1 in a short time, thus in the selecting state of a voltage controlled oscillator group 4 having different control voltage-oscillation frequency characteristics, malfunction can be prevented.

As has been described above, in a semiconductor integrated circuit including four voltage controlled oscillators having different control voltage-oscillation frequency characteristics, conventionally, only the output signal S4 from the loop filter 3 to prevent malfunction when switching over voltage controlled oscillators has been forcibly controlled. However, in the present embodiment, by adding a circuit for changing a voltage value to forcibly set an output potential from the loop filter 3, and moreover, by forcibly synchronizing also an output phase of the frequency divider 5 with that of the reference signal, it becomes possible to select a preferred voltage controlled oscillator in a considerably short time.

Figure 4:
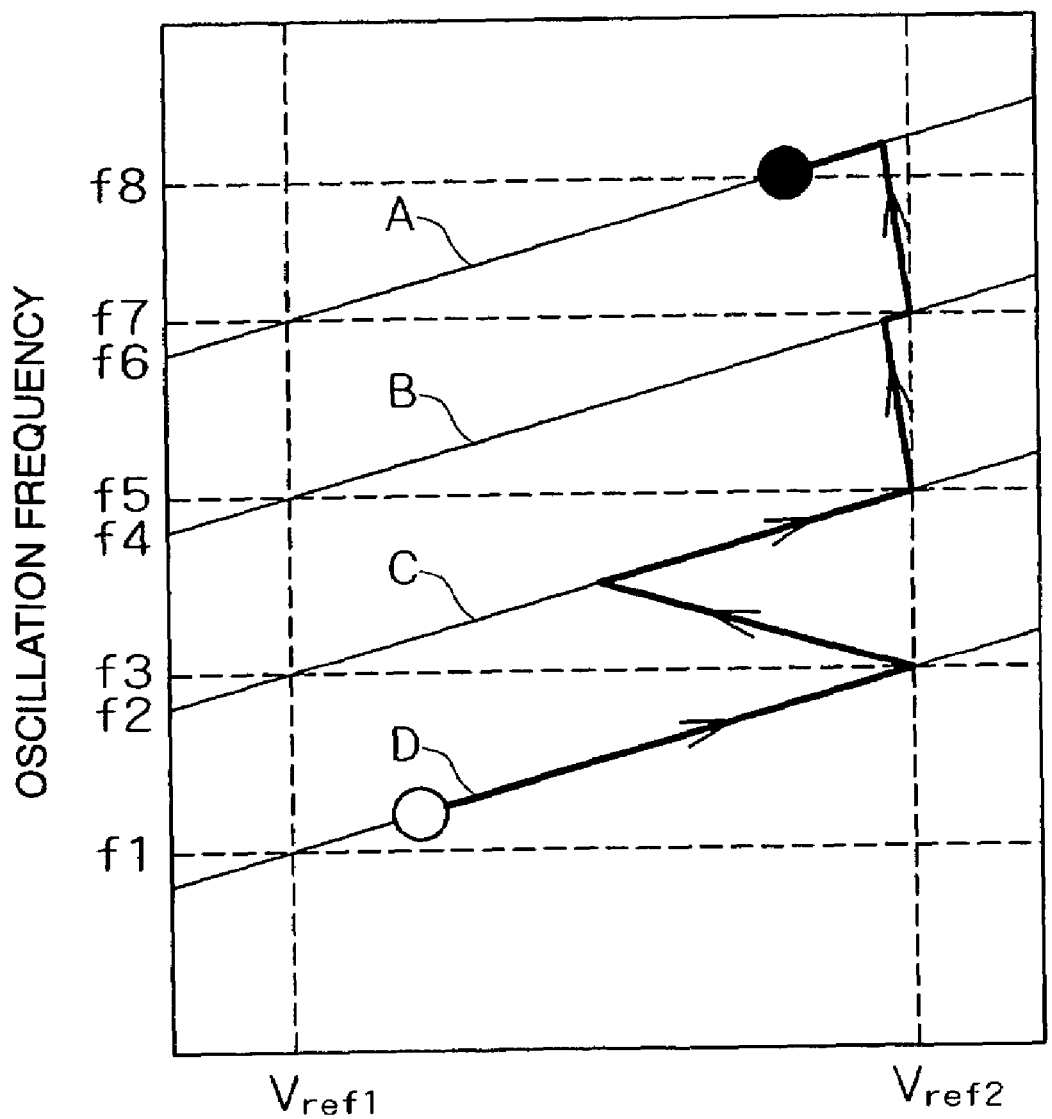
FIG. 4 is a characteristics diagram showing oscillation frequency characteristics, with respect to a voltage of a control signal, of a voltage controlled oscillator group shown in FIG. 3.

FIG. 4 is a characteristics diagram showing oscillation frequency characteristics of a voltage controlled oscillator group 4 shown in FIG. 3 with respect to a voltage of a control signal S4. Here, A to D are respectively control voltage-oscillation frequency characteristics of four oscillators, and frequencies f1 to f8 have a relationship of f1<f2<f3<f4<f5<f6<f7<f8.

First, description will be given for a case where a desirable oscillation frequency, namely, a quadruple frequency fosc of a reference signal CK1 to be inputted is f1<fosc<f2.

When a lock occurs only at a characteristic D shown in FIG. 4, namely, when voltage of the control signal S4 is not deviated from the range between the threshold voltage Vref1 and threshold voltage Vref2, the output signals S15 and S16 from the voltage comparators 418 and 419 never become high in potential (H), the counter 426 never performs a counting operation, and the condition of the selection circuit does not change from its initial condition.

In addition, when the characteristic shifts from the characteristic D to a characteristic C shown in FIG. 4, further shifts to a characteristic B, and the circuit is finally locked to a characteristic A, operations are as follows.

When the control voltage S4 exceeds the threshold voltage Vref2 at the characteristic D, the output signal S16 from the voltage comparator 418 becomes high in potential (H) for a fixed period of time, whereby, the counter 426 performs an up-counting operation by one. Simultaneously with the oscillator selecting state shifting from the characteristic D to the characteristic C, the signal S14 temporarily becomes high in potential (H), and the control signal S4 temporarily returns to the range between the threshold value Vref1 to threshold value Vref2, therefore, a change in the output signal S16 to a high potential (H) after switching over the voltage controlled oscillators is prevented.

Furthermore, by the 2-input AND circuit 7 into which the signal S14 and reference signal are inputted, since the frequency divider 5 is reset for a fixed period of time at a point in time of change in the voltage controlled oscillator selecting state, the phase of the reference signal and an output of the frequency divider 5 are synchronized, a great change in frequency caused by a change in the voltage controlled oscillator selecting state is detected by a phase comparator 1 in a short time, thus in the selecting state of a voltage controlled oscillator group 4 having different control voltage-oscillation frequency characteristics, malfunction is prevented.

Even after PLL control according to the characteristic C is performed as such, since frequency of the internal signal is still lower than the quadruple frequency of the reference signal, the control voltage S4 again exceeds the threshold voltage Vref2. At this time, since 2-bit output from the up history counter 427 simultaneously becomes high in potential (H), an output from the AND circuit 429 becomes high in potential (H), whereby, an output S4 from the loop filter 3 is forcibly set lower than the threshold value Vref2 and in the vicinity thereof, and simultaneously, the frequency divider 5 also repeats the aforementioned operations, and the characteristic shifts to the characteristic B.

Even after PLL control according to the characteristic B is performed as such, since frequency of the internal signal is still lower than the quadruple frequency of the reference signal, the control voltage S4 again exceeds the threshold voltage Vref2, the selection circuit 6 repeats the aforementioned operations, and the characteristic shifts to the characteristic A.

At this point in time, the voltage controlled oscillator is outputting a frequency roughly the same as that of the reference signal, while the phase of the frequency divider 5 also has a value according thereto, therefore, the two frequencies are thereafter equalized, and a lock finally occurs at the characteristic A.

On the other hand, if, for example, the frequency of the reference signal CK1 is switched over so as to make a desirable oscillation frequency fosc f1<fosc<f2 in a condition currently being locked to the characteristic A, the characteristic switches over, for example, from the characteristic A to the characteristic B to the characteristic C to the characteristic D, and the circuit is finally locked to the characteristic D.

Figure 5:
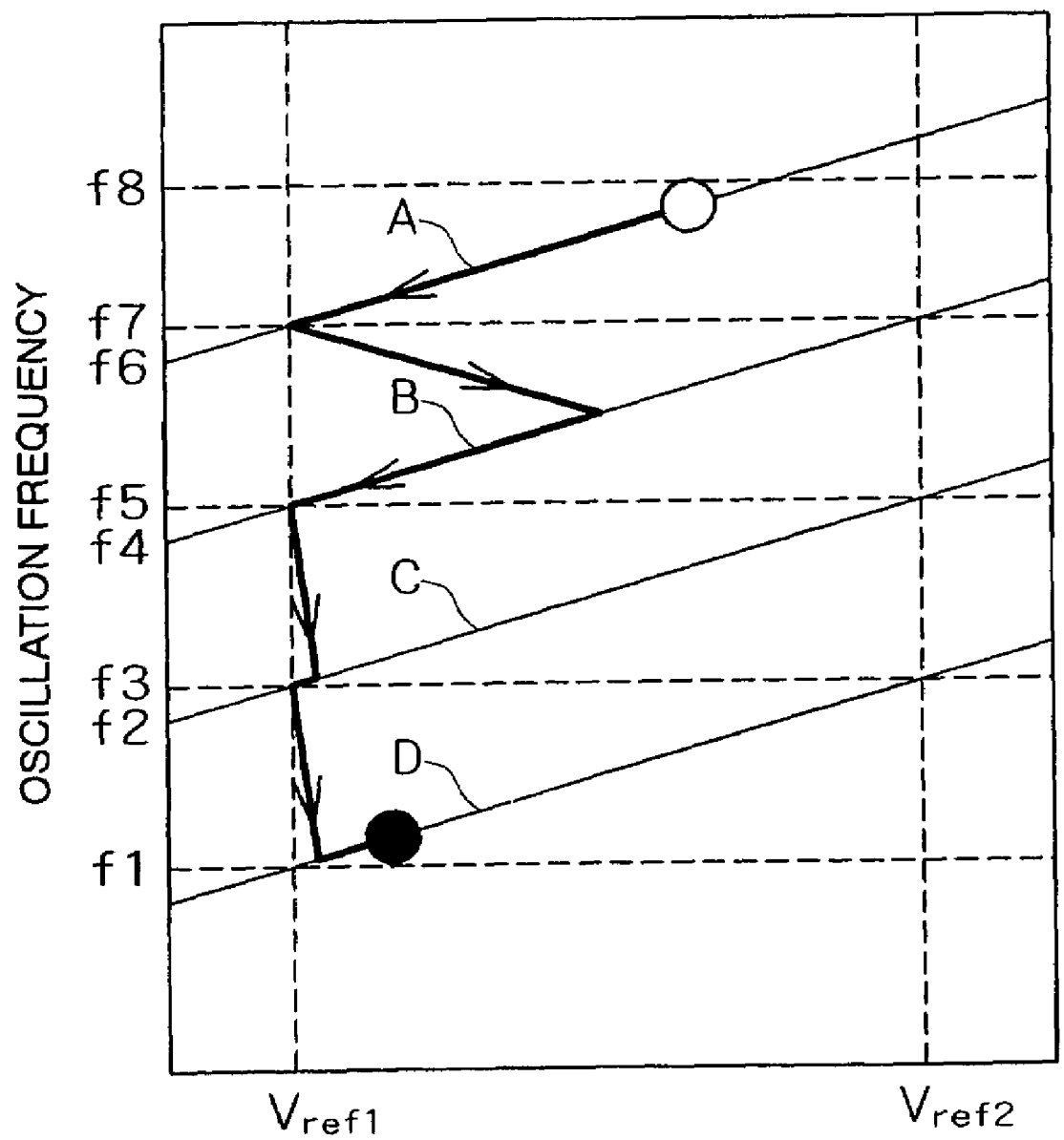
FIG. 5 is a characteristics diagram showing oscillation frequency characteristics, with respect to a voltage of a control signal, of a voltage controlled oscillator group shown in FIG. 3.

FIG. 5 is a characteristics diagram showing oscillation frequency characteristics of a voltage controlled oscillator group 4 shown in FIG. 3 with respect to a voltage of a control signal S4.

As described above, in the present embodiment, the output value S4 from the loop filter 3 is set in the vicinity of the threshold voltage Vref1 or threshold voltage Vref2, however, this becomes effective when a necessity to greatly change frequency arises. This is because, during a use within an identical band, normally, it is sufficient to finely adjust frequency in a frequency range of not more than two voltage controlled oscillators, however, when jumping to a different band, a necessity to greatly change frequency arises.

(Third Embodiment)

Figure 6:
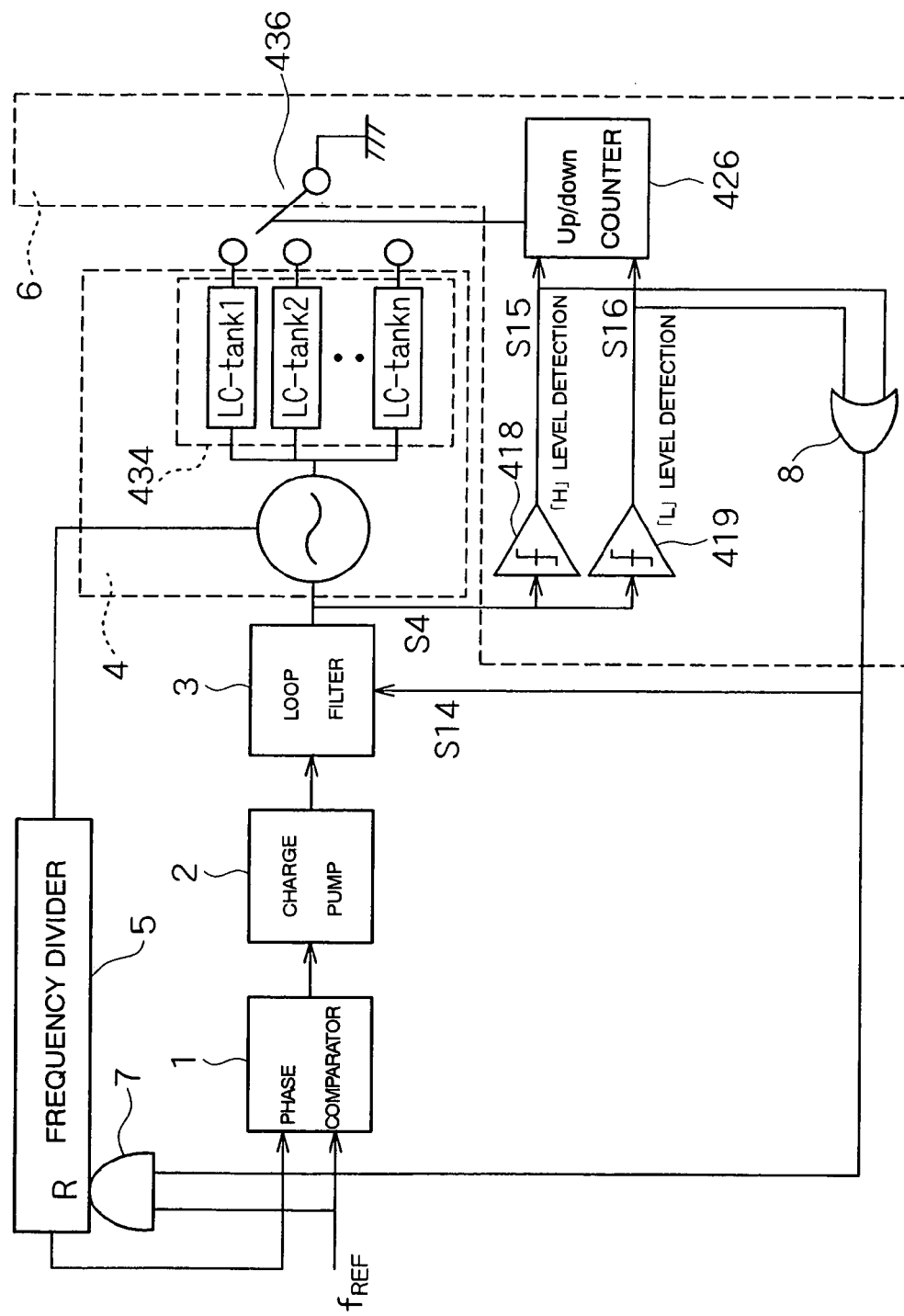
FIG. 6 is a block diagram showing a configuration example of a quadruple circuit to which a third embodiment of a PLL circuit of the present invention has been applied.

FIG. 6 is a block diagram showing a configuration example of a quadruple circuit to which a third embodiment of a PLL circuit of the present invention has been applied. Here, in FIG. 6, identical symbols will be used for components identical to those shown in FIG. 1, whereby a detailed description thereof will be omitted.

As shown in FIG. 6, in the present embodiment, for components shown in the first embodiment, a resonant circuit group 434 composed of a plurality of resonant circuits having different resonance frequencies is provided in place of voltage controlled oscillators having different frequency variable ranges, and by switching over a plurality of resonant circuits, obtaining effects similar to those shown in the first embodiment is intended. Here, a resonant circuit is normally composed of an inductor and a capacitor.

Fourth Embodiment

Figure 7:
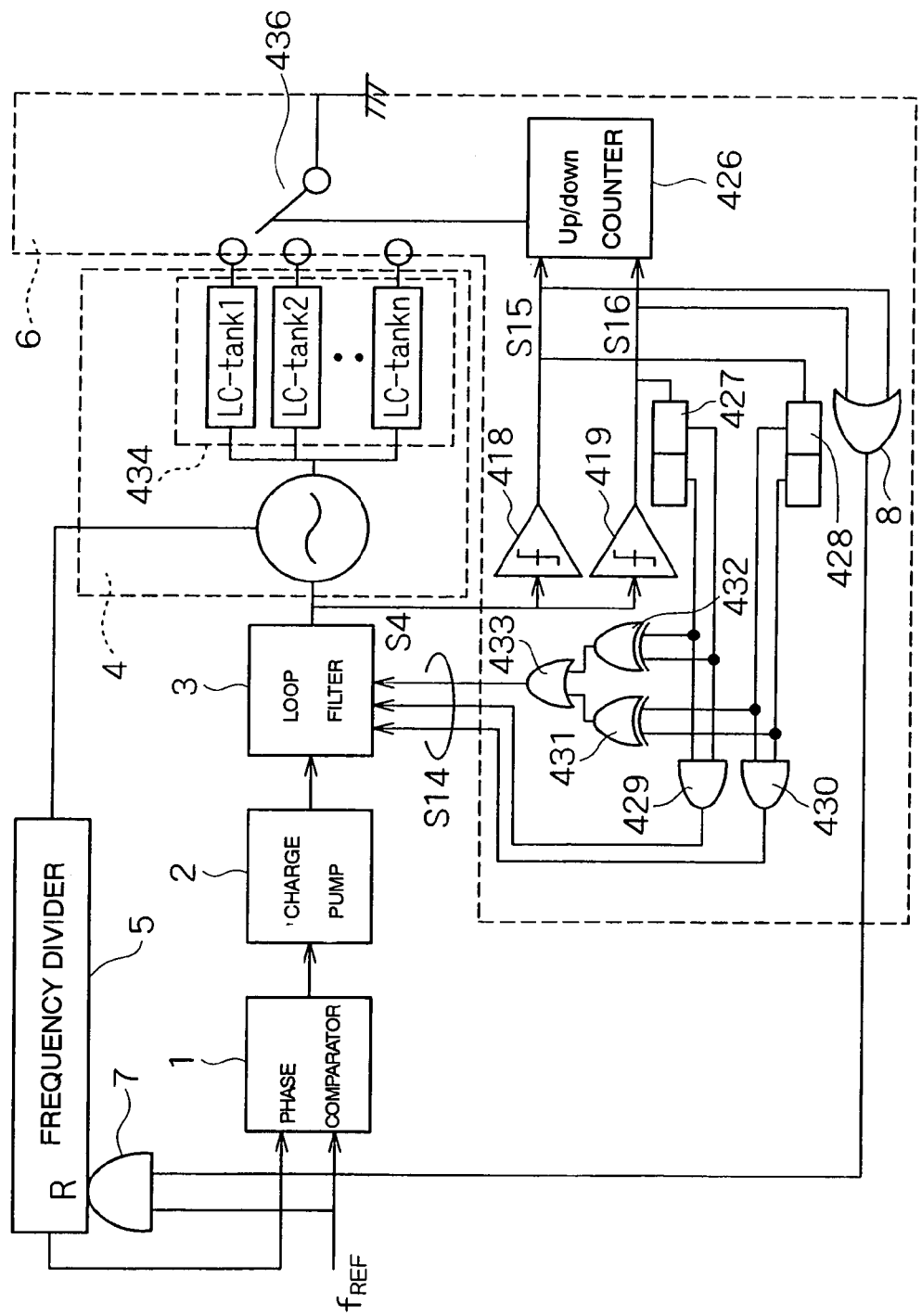
FIG. 7 is a block diagram showing a configuration example of a quadruple circuit to which a fourth embodiment of a PLL circuit of the present invention has been applied.

FIG. 7 is a block diagram showing a configuration example of a quadruple circuit to which a fourth embodiment of a PLL circuit of the present invention has been applied. Here, identical symbols will be used for components identical to those shown in FIG. 1, whereby a detailed description thereof will be omitted.

As shown in FIG. 7, in the present embodiment, for components shown in the second embodiment, a resonant circuit group 434 composed of a plurality of resonant circuits having different resonance frequencies is provided in place of voltage controlled oscillators having different frequency variable ranges, and by switching over a plurality of resonant circuits, obtaining effects similar to those shown in the second embodiment is intended. Here, a resonant circuit is normally composed of an inductor and a capacitor.

(Fifth Embodiment)

Figure 8:
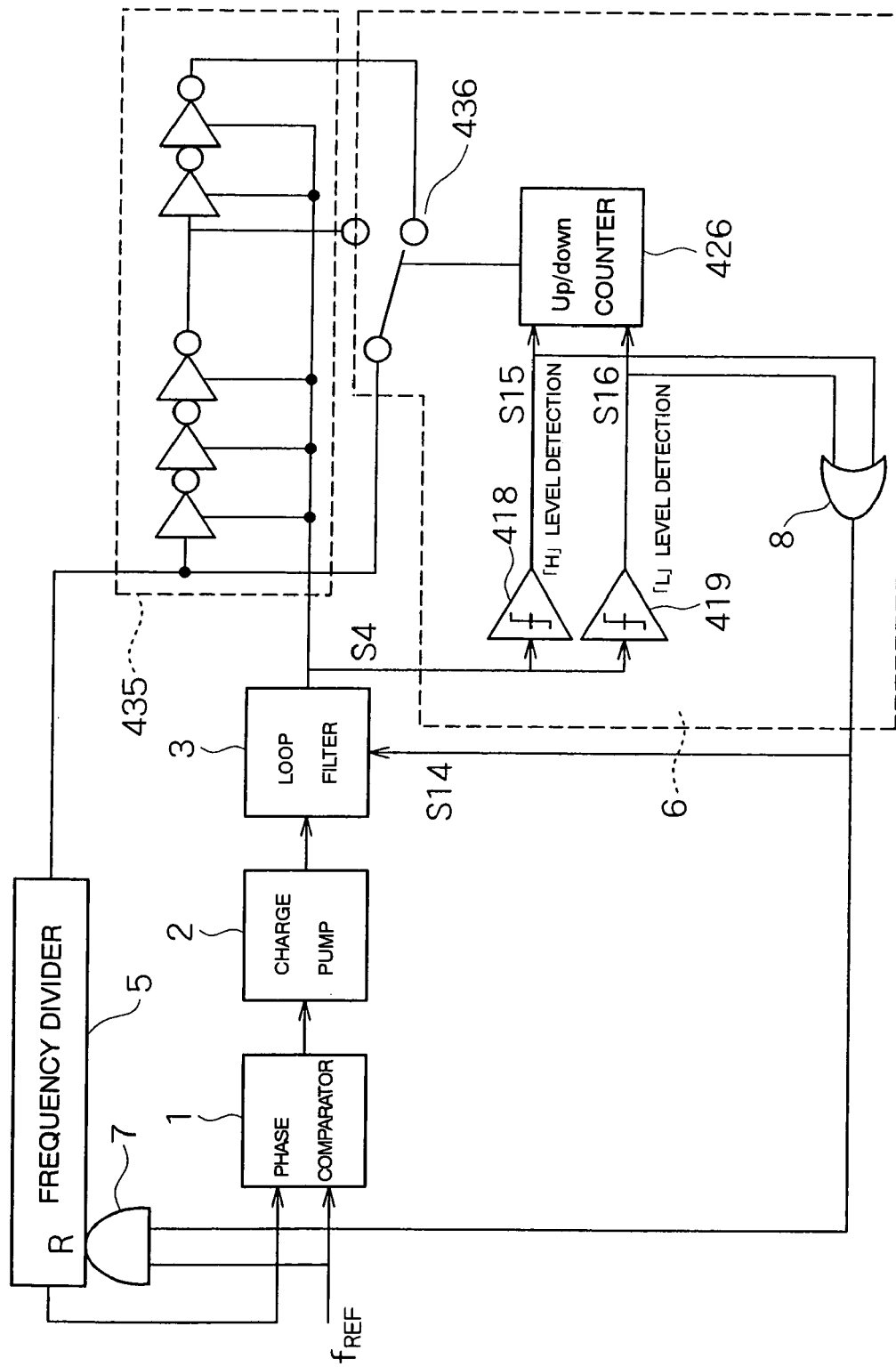
FIG. 8 is a block diagram showing a configuration example of a quadruple circuit to which a fifth embodiment of a PLL circuit of the present invention has been applied.

FIG. 8 is a block diagram showing a configuration example of a quadruple circuit to which a fifth embodiment of a PLL circuit of the present invention has been applied. Here, identical symbols will be used for components identical to those shown in FIG. 1, whereby a detailed description thereof will be omitted.

As shown in FIG. 8, in the present embodiment, for components shown in the first embodiment, a ring oscillator 435 to which a plurality of inverters whose delay times are variable have been connected by coupling is provided in place of voltage controlled oscillators having different frequency variable ranges. In the present embodiment, by switching over a coupling number of the ring oscillator 435, frequency can be changed in a wide range.

(Sixth Embodiment)

Figure 9:
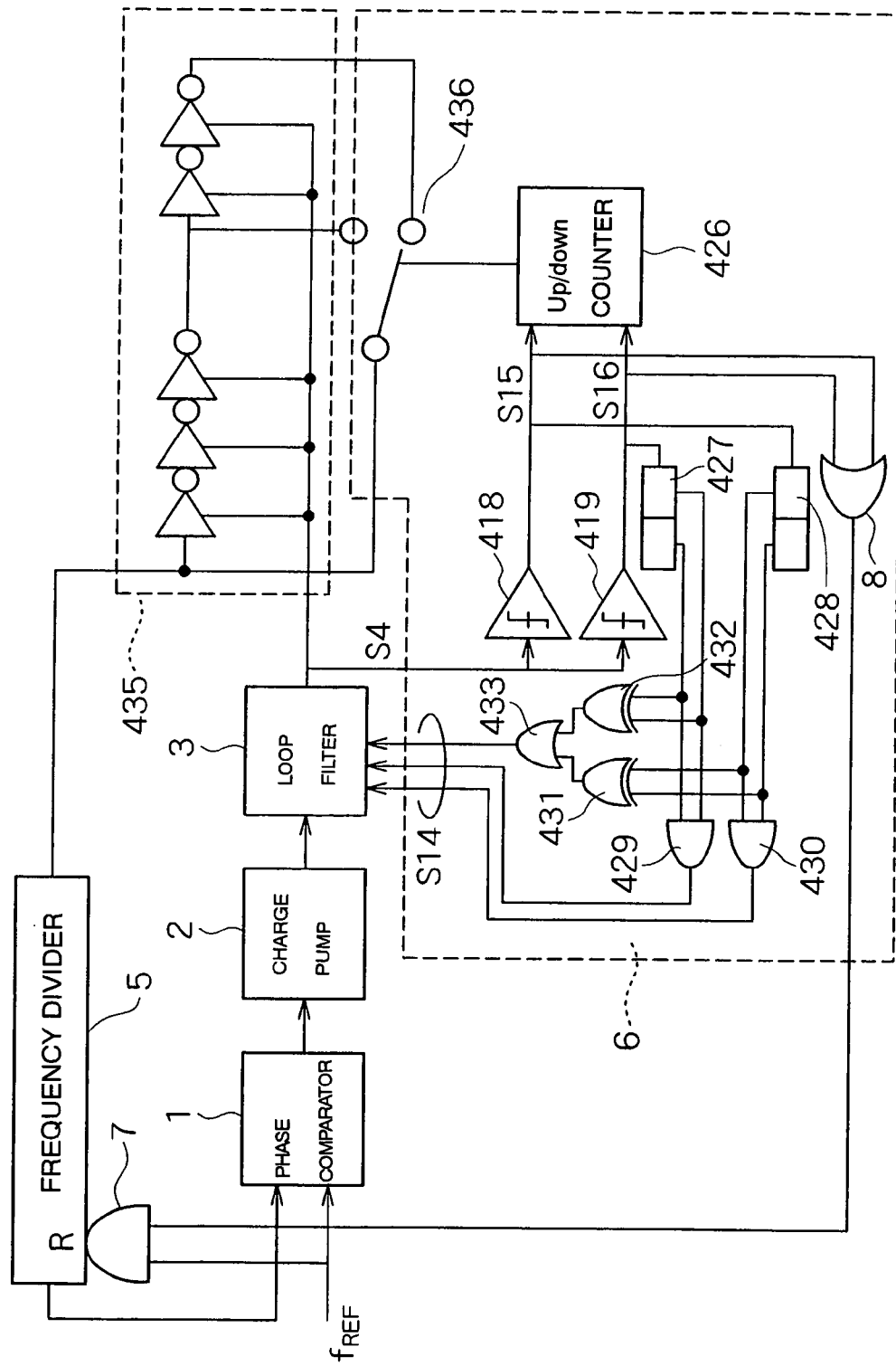
FIG. 9 is a block diagram showing a configuration example of a quadruple circuit to which a sixth embodiment of a PLL circuit of the present invention has been applied.

FIG. 9 is a block diagram showing a configuration example of a quadruple circuit to which a sixth embodiment of a PLL circuit of the present invention has been applied. Here, identical symbols will be used for components identical to those shown in FIG. 1, whereby a detailed description thereof will be omitted.

As shown in FIG. 9, in the present embodiment, for components shown in the second embodiment, a ring oscillator 435 to which a plurality of inverters whose delay times are variable have been connected by coupling is provided in place of voltage controlled oscillators having different frequency variable ranges. In the present embodiment, by switching over a coupling number of the ring oscillator 435, frequency can be changed in a wide range.

Here, in the aforementioned six embodiments, although description has been given for cases where four voltage controlled oscillators having different control voltage-oscillation frequency characteristics were included, it is also possible to similarly construct a quadruple circuit for a case where two or more arbitrary numbers of voltage controlled oscillators are included.

In addition, in the aforementioned embodiments, although voltage controlled oscillators having such characteristics that the oscillation frequency is heightened as the voltage of the control signal S4 becomes higher in potential, it is also possible to use voltage controlled oscillators having opposite operating characteristics, namely, characteristics that the oscillation frequency is lowered as the voltage of the control signal S4 becomes higher in potential. In this case, if the threshold voltages Vref1 and Vref2 are used as they are, the characteristic for PLL locking switches over to a characteristic higher in frequency than a current characteristic when the voltage of the signal S4 becomes less than the threshold voltage Vref1, and it switches over to a lower-frequency characteristic when the voltage of the signal S4 becomes the threshold voltage Vref2 or more.

In addition, although description has been given of each of the four voltage controlled oscillators composing a voltage controlled oscillator group 4 while providing that the threshold voltages Vref1 and Vref2 were all identical, it can also be considered that the threshold voltages Vref1 and Vref2 are different for each of the four voltage controlled oscillators.

INDUSTRIAL APPLICABILITY

The present invention relates to a PLL circuit which is preferably used, by use of a plurality of voltage controlled oscillators having different control voltage-oscillation frequency characteristics, for mobile communication systems to realize a multiband radio function, namely, a transmitting and receiving function in multiple frequency bands and which makes it possible to select, in a short time, a required voltage controlled oscillator according to a desirable oscillation frequency.

What is claimed is:

1. A PLL circuit comprising:
a phase comparing means for comparing phases between a reference signal and an internal signal and outputting a phase difference signal according to a phase difference therebetween;
a plurality of oscillators which have mutually different frequency variable ranges and whose frequencies are respectively controlled in accordance with a phase difference signal;
a selecting means for selecting one of the outputs from the plurality of oscillators based on the phase difference signal; and
a frequency dividing means for generating the internal signal by dividing an oscillator output selected by the selecting means, wherein
provided is a means for approximating, when the oscillator selecting state is changed, an output phase of the frequency dividing means to the phase of the reference signal.

2. The PLL circuit according to claim 1, wherein the plurality of oscillators have mutually overlapping frequency variable ranges.

3. The PLL circuit according to claim 1, wherein the plurality of oscillators have mutually different operating frequency range.

4. The PLL circuit according to claim 1, wherein the selecting means switches over outputs from the plurality of oscillators based on a history of the phase difference signal.

5. The PLL circuit according to claim 1, wherein the oscillators are voltage controlled oscillators, and provided is a means for converting the phase difference signal to an oscillator control voltage.

6. The PLL circuit according to claim 5, wherein provided is a means for setting two threshold voltages having mutually different values within a variable voltage range of the control voltage of the voltage controlled oscillator and temporarily setting, when the voltage controlled oscillator selecting state is changed, a value of the oscillator control voltage in a range between the two threshold voltages.

7. The PLL circuit according to claim 6, wherein provided is a means for changing a value of the temporarily setting oscillator control voltage in accordance with a history when the voltage controlled oscillator selecting state is changed.

8. The PLL circuit according to claim 6, wherein when the voltage controlled oscillator selecting state is switched over as a result of the oscillator control voltage becoming out of the range between the two threshold voltages, the temporarily setting phase control voltage is set, out of the two threshold voltages, in the vicinity of the oscillator control voltage-side threshold voltage.

9. The PLL circuit according to claim 6, wherein when the voltage controlled oscillator selecting state is switched over as a result of the oscillator control voltage becoming out of the range between the two threshold voltages and when the oscillator control voltage becomes out of the range between the two threshold voltages twice or more in series, the temporarily setting oscillator control voltage is set, out of the two threshold voltages, in the vicinity of the oscillator control voltage-side threshold voltage.

10. The PLL circuit according to claim 6, wherein when the oscillator control voltage becomes out of the range between the two threshold voltages, depending on whether this oscillator control voltage is higher than the two threshold voltages or lower than the two threshold voltages, whether setting the oscillator control voltage higher or setting the same lower than an intermediate potential between the two threshold voltages is controlled.

11. The PLL circuit according to claim 1, wherein the output phase of the frequency dividing means is synchronized with the phase of the reference signal.

12. A PLL circuit comprising:
a phase comparing means for comparing phases between a reference signal and an internal signal and outputting a phase difference signal according to a phase difference therebetween;
a plurality of resonant circuits provided with mutually different resonance frequencies;
an oscillator whose oscillation frequency is controlled in accordance with the resonant circuits and a phase difference signal;
a selecting means for selecting one of the plurality of resonant circuits based on the phase difference signal; and
a frequency dividing means for generating the internal signal by dividing an output from the oscillator, wherein
provided is a means for approximating, when the resonant circuit selecting state is changed, an output phase of the frequency dividing means to the phase of the reference signal.

13. The PLL circuit according to claim 12, wherein the selecting means switches over the plurality of resonant circuits based on a history of the phase difference signal.

14. The PLL circuit according to claim 12, wherein the oscillator is a voltage controlled oscillator, and provided is a means for converting the phase difference signal to an oscillator control voltage.

15. The PLL circuit according to claim 14, wherein provided is a means for setting two threshold voltages having mutually different values within a variable voltage range of the control voltage of the voltage controlled oscillator and temporarily setting, when the resonant circuit selecting state is changed, a value of the oscillator control voltage in a range between the two threshold voltages.

16. The PLL circuit according to claim 13, wherein provided is a means for changing a value of the temporarily setting oscillator control voltage in accordance, with a history when the resonant circuit selecting state is changed.

17. The PLL circuit according to claim 13, wherein when the resonant circuit selecting state is switched over as a result of the oscillator control voltage becoming out of the range between the two threshold voltages, the temporarily setting oscillator control voltage is set, out of the two threshold voltages, in the vicinity of the oscillator control voltage-side threshold voltage.

18. The PLL circuit according to claim 13, wherein when the resonant circuit selecting state is switched over as a result of the oscillator control voltage becoming out of the range between the two threshold voltages and when the oscillator control voltage becomes out of the range between the two threshold voltages twice or more in series, the temporarily setting oscillator control voltage is set, out of the two threshold voltages, in the vicinity of the oscillator control voltage-side threshold voltage.

19. The PLL circuit according to claim 13, wherein
when the oscillator control voltage becomes out of the range sandwiched between the two threshold voltages, depending on whether this oscillator control voltage is greater than the two threshold voltages or smaller than the two threshold voltages, whether setting the oscillator control voltage higher or setting the same lower than an intermediate potential between the two threshold voltages is controlled.

20. A PLL circuit comprising:
a phase comparing means for comparing phases between a reference signal and an internal signal and outputting a phase difference signal according to a phase difference therebetween;
an oscillator constructed by coupling a plurality of delay circuits whose delay times are respectively controlled in accordance with a phase difference signal;
a selecting means for switching over the coupling number of delay circuits based on the phase difference signal; and
a frequency dividing means for generating the internal signal by dividing an oscillator output selected by the selecting means, wherein
provided is a means for approximating, when the oscillator selecting state is changed, an output phase of the frequency dividing means to the phase of the reference signal.

21. The PLL circuit according to claim 20, wherein
the selecting means switches over the coupling number of the delay circuits based on a history of the phase difference signal.

22. The PLL circuit according to claim 20, wherein the oscillator is a voltage controlled oscillator, and provided is a means for converting the phase difference signal to an oscillator control voltage.

23. The PLL circuit according to claim 22, wherein
provided is a means for setting two threshold voltages having mutually different values within a variable voltage range of the control voltage of the voltage controlled oscillator and temporarily setting, when the delay circuit coupling number selecting state is changed, a value of the oscillator control voltage in a range between the two threshold voltages.

24. The PLL circuit according to claim 23, wherein
provided is a means for changing a value of the temporarily setting oscillator control voltage in accordance with a history when the delay circuit coupling number selecting state is changed.

25. The PLL circuit according to claim 23, wherein
when the delay circuit coupling number selecting state is switched over as a result of the oscillator control voltage becoming out of the range between the two threshold voltages, the temporarily setting oscillator control voltage is set, out of the two threshold voltages, in the vicinity of the oscillator control voltage-side threshold voltage.

26. The PLL circuit according to claim 23, wherein
when the delay circuit coupling number selecting state is switched over as a result of the oscillator control voltage becoming out of the range between the two threshold voltages and when the oscillator control voltage becomes out of the range between the two threshold voltages twice or more in series, the temporarily setting oscillator control voltage is set, out of the two threshold voltages, in the vicinity of the oscillator control voltage-side threshold voltage.

27. The PLL circuit according to claim 23, wherein
when the oscillator control voltage becomes out of the range between the two threshold voltages, depending on whether this oscillator control voltage is greater than the two threshold voltages or smaller than the two threshold voltages, whether setting the oscillator control voltage higher or setting the same lower than an intermediate potential between the two threshold voltages is controlled.

* * * * *